(12) United States Patent
Mansfield et al.

(10) Patent No.: US 6,404,609 B1
(45) Date of Patent: Jun. 11, 2002

(54) CIRCUIT THAT REDUCES THE NUMBERS OF COMPONENTS NEEDED TO TRANSMIT DATA FROM INTRINSICALLY SAFE TO NON-INTRINSICALLY SAFE CIRCUITS USING OPTO-COUPLERS

(75) Inventors: William M. Mansfield, Lafayette; Craig B. McAnally, Thornton, both of CO (US)

(73) Assignee: Micro Motion, Inc., Boulder, CO (US)

( * ) Notice: Subject to any disclaimer, the term of this patent is extended or adjusted under 35 U.S.C. 154(b) by 0 days.

(21) Appl. No.: 09/541,129

(22) Filed: Mar. 31, 2000

(51) Int. Cl.[7] .................................................. H02H 5/04
(52) U.S. Cl. ..................................................... 361/103
(58) Field of Search .............................. 361/103, 115; 323/223; 55/60 C

(56) References Cited

U.S. PATENT DOCUMENTS

| | | | | |
|---|---|---|---|---|
| 4,420,840 A | * | 12/1983 | Livermore | .................. 455/606 |
| 5,014,156 A | | 5/1991 | Bruch et al. | .................. 361/58 |
| 5,164,607 A | * | 11/1992 | Weigert et al. | ............. 250/577 |
| 5,343,192 A | * | 8/1994 | Yenisey | ....................... 340/639 |
| 5,747,972 A | * | 5/1998 | Baretich et al. | ............. 323/223 |
| 6,169,649 B1 | * | 1/2000 | Fasullo et al. | ............. 361/115 |
| 6,229,288 B1 | * | 5/2001 | Baretich et al. | ............. 323/223 |

FOREIGN PATENT DOCUMENTS

| | | | |
|---|---|---|---|
| GB | 1489072 | * | 2/1974 |
| GB | 2165053 | * | 9/1984 |
| JP | 11069599 | * | 8/1997 |

* cited by examiner

*Primary Examiner*—Peter S. Wong
*Assistant Examiner*—Pia Tibbits
(74) *Attorney, Agent, or Firm*—Faegre & Benson LLP

(57) ABSTRACT

The described circuit is an intrinsically safe circuit configured for supplying intrinsically safe power from a power supply in a hazardous environment. The intrinsically safe circuit reduces a number of node connections by reducing a number of components. The intrinsically safe circuit comprises an opto-coupler circuit configured for receiving a control signal, a resistor, and a single voltage limiting circuit. The reduction in components and node connections results in a reduction of board costs and area, while maintaining a desired level of protection.

12 Claims, 1 Drawing Sheet

CIRCUIT THAT REDUCES THE NUMBERS OF COMPONENTS NEEDED TO TRANSMIT DATA FROM INTRINSICALLY SAFE TO NON-INTRINSICALLY SAFE CIRCUITS USING OPTO-COUPLERS

FIELD OF THE INVENTION

This invention relates to transmitting data from intrinsically safe circuits to non-intrinsically safe circuits. More particularly, this invention relates an opto-coupler used to transmit data between the circuits. Still more particularly, this invention relates to circuitry connected to a phototransistor to prevent excess energy from being applied to the opto-coupler.

PROBLEM

Opto-couplers comprising an LED and an associated phototransistor fabricated together as a single device are known and are widely used in applications in which DC and AC isolation must be maintained between a signal source and a signal output representing an amplified or processed input signal. Opto-couplers are used in instances in which the isolation provided by capacitance coupling between an input and an output circuit is not sufficient.

One such instance in which capacitance coupling is not sufficient occurs when input and output circuits are operated in hazardous locations. In such instances, it is well known to use opto-coupler circuitry in which an LED receives an input signal to be amplified or otherwise processed and, in so doing, generates an optical output signal representative of the received input signal. The LED is part of a device package that also includes a phototransistor that has a base that receives the optical output of the LED and, in turn, controls the collector current of the phototransistor. The phototransistor may be advantageously operated as an amplifier whose output is developed across a collector resistor.

An opto-coupler operated in this manner provides increased isolation compared to that provided by the capacitor connected transistor amplifier. The isolation provided by an opto-coupler is needed to connect intrinsically safe circuitry to non-intrinsically safe circuits. Intrinsically safe circuits are circuits that operate under a certain low energy level. By operating under a certain energy level, the circuitry is ensured not to generate a spark or sufficient heat to cause an explosion of material in a hazardous environment even if the circuitry fails in some manner. The power level needed to make circuitry intrinsically safe is determined by regulatory agencies such as the UL in the United States, CENELEC in Europe, CSA in Canada, and TIIS in Japan.

In order to be intrinsically safe, the intrinsically safe circuit must have a galvanic isolation barrier between the intrinsically safe circuit and circuitry that is not intrinsically safe. In order to transmit digital data across the galvanic isolation barrier, a large number of safety components are needed. In an opto-coupler, either the LED or the phototransistor is part of the intrinsically safe circuit.

In a common emitter configuration, the phototransistor saturates and an output voltage from the phototransistor is equal to a saturation voltage of a collector of the phototransistor when the phototransistor is activated by the LED. When the phototransistor is inactive, the output voltage is equal to a power supply voltage. In operation the terminals connected to the phototransistor must not exceed two thirds ($\frac{2}{3}$) of the maximum current, voltage, or power rating of the opto-coupler. To prevent the terminals connected to the phototransistor from exceeding the maximums, a zener diode and a suitably rated fuse connected to a terminal is typically considered sufficient protection for the terminals. A resistor is also commonly added to prevent against the breaking capacity of the fuse. In this configuration, the diode and the fuse are connected to the collector of the phototransistor and the power supply, thereby increasing the number of components. However, the on all three connections increase circuit size. As the cost of components increases and the board size of circuits decreases, there is a need to configure such circuits in a manner that reduces board cost.

SOLUTION

The above and other problems are solved and an advance in the art is made by the protection circuitry of this invention. The circuitry of this invention reduces the number of node connections for a phototransistor to two nodes. A single Zener diode, a fuse, and a resistor provide protection. This reduces the number of components needed, which in turn reduces board cost and board area needed.

In accordance with this invention, the power supply connection to a collector of the phototransistor is reduced to a signal node. Collector-emitter current is conducted to an output resistor to toggle a data line. The power supply connection and collector are reduced to a single node using a resistor circuit connected between the power supply connection and collector. The use of the resistor allows the opto-coupler to remain powered by a dedicated supply current.

In a first aspect of this invention, circuitry that prevents an opto-coupler from exceeding a particular power rating is comprised of the following components. A resistor circuit connects a collector of a phototransistor to a power supply. A fuse connects the power supply to the resistor circuit. A diode connected to the fuse and to the resistor. Finally, a fuse resistor is connected to and between the fuse and the diode.

In another aspect of this invention, a resistor may connect the power supply at a first terminal and to the output resistor between the power supply resistor and the diode.

In another aspect of this invention, an output resistor may be connected between the emitter and ground. The output resistor may be a 604 ohms resistor.

In another aspect of this invention the power supply may provide 14 volts to the circuitry.

In another aspect of this invention the resistor circuit may be a 1.0 kilo ohms resistor.

In another aspect of this invention the fuse may be a 63 milliamp fuse.

In another aspect of this invention, the ground resistor may be a 49.9 kilo Ohms resistor.

In another aspect of this invention the fuse resistor may be a 6.2 Ohms resistor.

In another aspect of this invention, the diode is a 16.0 Volts Zener diode.

DESCRIPTION OF THE DRAWINGS

The above and other aspects of this invention are described in the detailed description and the following drawings.

DETAILED DESCRIPTION

Figure 1:
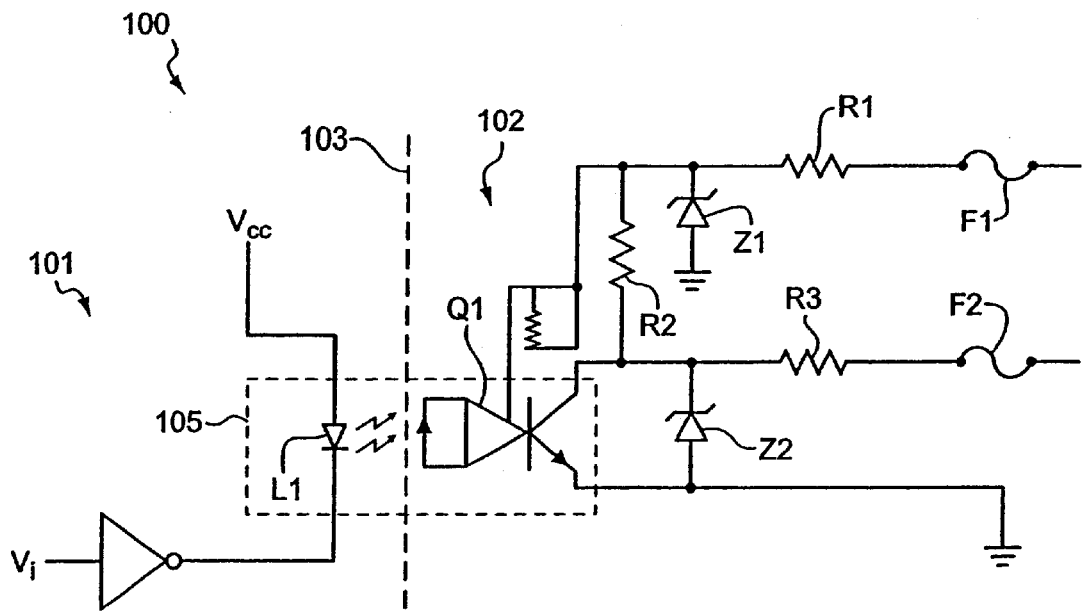
FIG. 1 illustrating a prior art opto-coupler and protection circuitry.

FIG. 1 illustrates prior art circuitry 100 that includes intrinsically safe circuit 101 and non-intrinsically safe circuit 102. Galvanic isolation barrier 103 provides a separation between intrinsically safe circuit 101 and non-intrinsically safe circuit 102 in accordance with safety specifications. Light Emitting Diode (LED) L1 and phototransistor Q1 form an opto-coupler 105 that passes an optical signal from intrinsically safe circuit 101 to non-intrinsically safe circuit 102.

Opto-coupler 105 is a conventional opto coupler such as a Hewlett Packard HCNW 4506 opto-coupler. In order to transmit data, LED L1 transmits light signals control phototransistor Q1. When Q1 is "turned on", phototransistor conducts current. Output voltage, Vo, is equal to a collector-emitter voltage of phototransistor Q1. When phototransistor Q1 is "turned off", the output voltage, Vo, is pulled to Vdd. A power supply connection to Q1 supplies a bias voltage, Vdd.

In accordance to standards, such as Cenelec document EN 50020 titled "Electrical Apparatus for potentially explosive atmospheres-intrinsic Safety," the non-intrinsically safe terminal of an opto-coupler must have protective circuitry that ensures the opto-coupler does not exceed two-thirds of a maximum current, maximum voltage, or maximum power rating. In the prior art, two of three nodes of the phototransistor are protected by fuses.

In order to protect a phototransistor Q1, fuse F1 is connected between a power supply and the has a cathode connected to phototransistor Q1 and to fuse F1 and an anode connected to receive a ground reference potential. Resistor R1 is connected between fuse F1 and diode Z1 to protect the breaking capacity of the fuse.

A collector node of phototransistor Q1 supplies Vo. The collector node is connected to the power supply node by resistor R2. Fuse F2 is also connected to the collector node. Diode Z2 has a cathode connected to the collector node of phototransistor Q1 and an anode connected to receive a ground reference potential. Resistor R3 is connected between the collector node and fuse F2 and protects the breaking capacity of the fuse. An emitter node of phototransistor Q1 is connected to ground and to the anode of Diode Z2.

Figure 2:
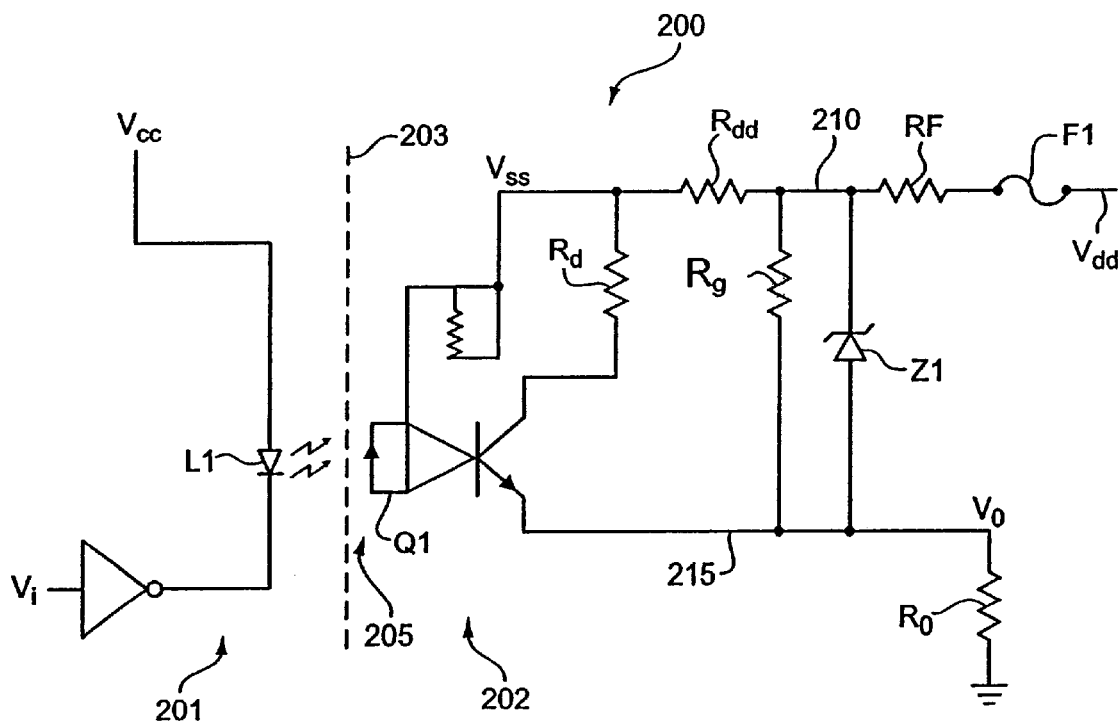
FIG. 2 illustrating an opto-coupler and protection circuitry in accordance with this invention.

FIG. 2 illustrates an exemplary embodiment of circuitry having protection circuitry in accordance with the present invention. The circuitry of this invention reduces the number of nodes in order to reduce the number of components needed to provide protection against the opto-coupler exceeding two thirds of the maximum voltage, maximum current or maximum power of the opto-coupler. Circuit 200 includes intrinsically safe circuit 201 and non-intrinsically safe circuit 202. Galvanic isolation barrier 203 separates intrinsically safe circuit 201 and non-intrinsically safe circuit 202. LED L1 and phototransistor Q1 form opto-coupler 205. An exemplary opto-coupler is the HCNW 4506 opto-coupler produced by Hewlett Packard. Opto-coupler 205 transmits an optical control signal through the galvanic isolation barrier 203 located between intrinsically safe circuit 201 and non-intrinsically safe circuit 202.

Phototransistor Q1 has a power supply node, a collector node and an emitter node. A power supply is connected to phototransistor Q1. A fuse F1 is in path 210 between the power supply and fuse resistor Rf. Fuse resistor Rf in path 210 is connected between Fuse F1 and phototransistor Q1. The breaking capacity of fuse F1 is protected by fuse resistor Rf. Diode Z1 connects path 210 to path 215 with a cathode that is connected to the fuse resistor Rf and an anode that is connected to the output of the circuit. Diode Z1 regulates a voltage. Power supply resistor Rdd is connected to the cathode of diode Z1 and the phototransistor Q1. A resistor Rg is connected to path 210 and path 215 between power supply resistor Rdd and diode Z1.

Power supply resistor Rdd is connected between phototransistor Q1 and the fuse resistor Rf in path 210. The collector of phototransistor Q1 is connected to resistor Rd. Resistor Rd connects the collector to path 210 via power supply resistor Rdd. The connection of the collector of phototransistor Q1 to path 210 allows a single fuse and a single diode to provide protection to opto coupler 205.

Path 215 connects an emitter of the phototransistor Q1 to the output of the circuit. Output resistor Ro is connected between the emitter of the phototransistor Q1 and ground. Resistor Rg is connected to path 215 between the emitter of the phototransistor Q1 and output resistor Ro. Diode Z1 is connected to path 215 in parallel to resistor Rg between the emitter of the phototransistor Q1 and output resistor Ro.

According to Cenelec document EN 50020, opto-coupler 205 cannot exceed two thirds of the values shown in the following table.

| Parameter | Symbol | Maximum | Units |
| --- | --- | --- | --- |
| Output Current | Io | 15 | mA |
| Resistor Voltage | Vr | Vss | Volts |
| Output Voltage | Vo | 30 | Volts |
| Supply Voltage | Vss | 30 | Vo |

The following table includes values of the components of non-intrinsically safe circuit 201. The values will be used below to determine the values for voltage and current outputted by the circuit.

| Component | Symbol | Value | Units |
| --- | --- | --- | --- |
| Power Supply | Vdd | 14.0 | Volts |
| Fuse | F1 | 63 | mA |
| Fuse Resistor | Rf | 6.2 | Ohms |
| Supply Resistor | Rdd | 1.21K | Ohms |
| Divider Resistor | Rd | 1.0K | Ohms |
| Ground Resistor | Rg | 49.9K | Ohms |
| Output Resistor | Ro | 604 | Ohms |
| Zener Diode | Z1 | 16.0 | Volts |

When phototransistor Q1 is turned off, current from the power supply, $I_{cch}$, is limited to 0.6 mA. As a result, the output voltage can be determined from the following equation.

$$Vo = \left( \frac{Vdd}{Rf + Rg + Ro} + Icch \right) * Ro \qquad (1)$$

When the values from the table of component values are inserted into Equation 1, the output voltage when the transistor Q1 is inactive can be determined to be 0.53 volts. This is well under the values of 20 volts required.

When phototransistor is receiving signals from LED L1 and is active, phototransistor conducts current and the output voltage is determined by the following equation.

$$Vo = Vdd \left( \frac{Ro}{Rf + Ro + \frac{Rg(Rdd + Rd)}{Rd + Rdd + Rg}} \right) \quad (2)$$

By inserting values from the above table of component values, the output voltage when phototransistor Q1 is turned on is 3.10 Volts which is well under two thirds of the maximum output voltage given in the table of maximum ratings for opto-coupler 205.

The voltage of power from the power supply, Vss, varies according to whether phototransistor Q1 is turned on or off. When phototransistor Q1 is receives optical signals from LED L1, phototransistor Q1turns on and Vss is equal to the current flowing through resistor Rd. From equation 2, the current flowing through resistor Rd is:

$$IRd = \frac{(Vdd - Vo)}{\frac{Rg(Rdd + Rd)}{Rg + Rdd + Rd}} \quad (3)$$

By inserting values from the table of component values and the table of maximum values, the current flowing through the resistor Rd is 5.15 mA which gives a supply voltage Vss of 5.15 volts.

In this embodiment, supply voltage Vss, resistor voltage Vr, and output voltage Vo are limited by diode Z1. Therefore diode Z1 must limit to less than two-thirds of the maximum supply voltage from the table of maximums, or 20 Volts in the preferred embodiment. Fuse F1 limits the current from the power supply to prevent diode Z1 from exceeding the two-thirds power of the maximum supply voltage.

In the preferred embodiment, Diode Z1 has a rating of 3.0 watts therefore the maximum power through the diode is limited to 2.0 watts. The power through diode Z1 may be calculated in the following manner.

$$Pzener = 1.7 * IF1 * Vzmax \quad (4)$$

Where Vzmax is a voltage rating of diode Z1 plus the tolerance of the diode Z1 (5%) and a multiplier of 1.7 as required by Cenelec document En 50020 for circuits that include a fuse. Diode Z1 has a rating of 3.0 Watts which means that the maximum voltage power through the diode must be limited to 2.0 Watts. In the preferred embodiment, the maximum power through Diode Z1 is 1.8 Watts.

The breaking capacity of the fuse must also be protected. In a preferred embodiment, the breaking capacity of fuse F1 is 50 A and fuse F1 is rated at 250 Volts. Since the value of fuse resistor Rf is 6.2 Ohms as given in the table of component values, the current of fuse F1 is limited to 250 Volts divided by 6.2 Ohms or 40.3 A.

The last parameter sought is current through the collector of phototransistor Q1. Maximum current is reached when phototransistor Q1 is turned on. The maximum current can be determined by dividing the result of equation 4 by output resistor Ro value.

$$Icollector = \frac{1.7 * IF1 * Vzmax}{Ro} \quad (5)$$

In a preferred embodiment, output current is 5.13 mA when values from the tables of maximums and component values are inserted. This is less than two-thirds of the maximum value for an output current of 10 mA.

The above is a description of circuitry for providing protection for an opto-coupler. Those skilled in the art are expected to design alternative circuits that infringe this invention as set forth in the claims below either literally or through the Doctrine of Equivalents.

What is claimed is:

1. A circuit having an intrinsically safe side and a non-intrinsically safe side, said circuit receives an input signal on said intrinsically safe side to switch an output signal on said non-intrinsically safe side between a high state and a low state, said circuit comprising:

an optical coupler having a first conductive state of low impedance and a second conductive state of high impedance;

an input on said intrinsically safe side that receives multi-state input signals to switch said optical coupler between said conductive states;

said optical coupler is effective when in said first conductive state to apply a high potential signal to said output;

said optical coupler is effective when in said second conductive state to apply a low potential signal to said output;

said non-intrinsically safe side of said circuit comprises:
a power supply;
an output connectable to a data line;
a first series circuit including a first resistor connected between a first side of the power supply and said output;
said first series circuit is effective when said optical coupler is in said second conductive state to apply a current to said output in series with a load resistor to ground to generate a relatively low potential signal on said output;

said non-intrinsically safe circuit further comprises:
a second series circuit including a second resistor and an output side of said optical coupler connected between said first side of said power supply and said output;
said second series circuit is effective when said optical coupler is in said first conductive state to apply a relatively high current to said load resistor via said output to apply a relatively high output signal to said output.

2. The circuit of claim 1 wherein said output resistor is 604 Ohms.

3. The second resistor of claim 1 is 49.9 kilo Ohms.

4. The first resistor of claim 1 is 6.2 Ohms.

5. The circuit of claim 1 further comprising:
a diode that limits the voltage of the power supply to a predetermined magnitude;
said first series circuit comprises;
a second resistor that has a first side connected to the first side of the power supply;
said diode having a cathode connected to a second side of the second resistor and having an anode connected to the output, the diode limits a magnitude of the input voltage from the power supply to a predetermined magnitude of voltage;

said second series circuit comprises:

a third resistor having a first end connected to the cathode of the diode;

a fourth resistor having a first end connected to a second end of the third resistor and having a second end connected to one element of the opto-coupler;

said optical coupler has a second element connected to said output;

said optical coupler presents a high impedance between said first and second elements when in said first conductive state so current from said power supply and through said second series circuit to said output applies a low voltage signal to said output across said load resister;

said optical coupler presents a low impedance between said first and second elements when in a second state so that current from said power supply and through a series path comprising said first, second and third resistor and said optical coupler apply a relatively high voltage to said output across said load resistor.

6. The diode of claim 5 comprises a zener diode.

7. The zener diode of claim 6 is a 16.0 Volt zener diode.

8. The opto-coupler of claim 1, comprises:

a light emitting diode that receives the input signal from the intrinsically safe side of the circuit and generates an optical control signal in response to the reception of the input signal; and a phototransistor in said second series circuit, that receives an optical control signal in response to the generation of the optical input signal to control the magnitude of a current from the power supply to the output and in turn to control the voltage across the load resistor.

9. The phototransistor of claim 8 comprises a bipolar junction phototransistor that has a collector connected to the second end of the fourth resistor and an emitter connected to the output of the non-intrinsically safe side of the circuit.

10. A method of safely transferring an input signal in a hazardous environment from an intrinsically safe side of a circuit to a non-intrinsically safe side of the circuit for controlling the potential applied on a output of the non-intrinsically safe side of the circuit, said method comprising the steps of:

limiting a voltage from a power supply with a zener diode;

providing a first output voltage representative of a first state of state of an input signal;

receiving the electrical input signal by a light emitting diode within the intrinsically safe side of the circuit;

receiving an optical control signal by a photo-transistor within the non-intrinsically safe side of the circuit from the light emitting diode in response to the reception of the electrical input signal by the light emitting diode; and providing an output voltage representative of a second state of the electrical input signal to the output in response to the reception of the optical control signal.

11. The step of providing the first output voltage of claim 10 comprises:

converting the input voltage into a current with a first resistor; and applying the current to a second resistor to provide the first output voltage.

12. The step of providing the second output voltage of claim 10 comprises:

conducting a first current through the photo-transistor to a resistor in response to the reception of the optical control signal;

summing the first current and a second current; and conducting the summed first and second currents to a resistor to provide the second output voltage.

* * * * *